US008456061B2

(12) United States Patent
Gibbons et al.

(10) Patent No.: US 8,456,061 B2
(45) Date of Patent: Jun. 4, 2013

(54) ARCHITECTURE FOR PIEZOELECTRIC MEMS DEVICES

(75) Inventors: Brady J. Gibbons, Corvallis, OR (US); Chris Shelton, Portland, OR (US); Peter Mardilovich, Corvallis, OR (US); Tony S. Cruz-Uribe, Independence, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 339 days.

(21) Appl. No.: 13/013,494

(22) Filed: Jan. 25, 2011

(65) Prior Publication Data

US 2012/0187804 A1   Jul. 26, 2012

(51) Int. Cl.
*H01L 41/09* (2006.01)

(52) U.S. Cl.
USPC ............ 310/333; 310/358; 310/359; 29/25.35

(58) Field of Classification Search
USPC .......................... 310/333, 358, 359; 29/25.35
See application file for complete search history.

(56) References Cited

U.S. PATENT DOCUMENTS

| | | | | | |
|---|---|---|---|---|---|
| 4,482,833 | A | * | 11/1984 | Weinert et al. | 310/313 A |
| 4,640,756 | A | * | 2/1987 | Wang et al. | 204/192.18 |
| 5,059,847 | A | * | 10/1991 | Tanaka et al. | 310/313 A |
| 5,536,585 | A | * | 7/1996 | Futamoto et al. | 428/611 |
| 5,847,435 | A | * | 12/1998 | Ballato et al. | 257/417 |
| 6,348,754 | B1 | * | 2/2002 | Yoshida et al. | 310/313 A |
| 6,411,017 | B1 | * | 6/2002 | Qiu et al. | 310/358 |
| 6,794,683 | B2 | * | 9/2004 | Tatsumi et al. | 257/72 |
| 7,786,653 | B2 | | 8/2010 | Freidhoff et al. | |
| 2005/0168112 | A1 | * | 8/2005 | Aoki et al. | 310/358 |
| 2005/0227120 | A1 | * | 10/2005 | Ichihara et al. | 428/830 |
| 2008/0151009 | A1 | | 6/2008 | Kato | |
| 2008/0278038 | A1 | * | 11/2008 | Kobayashi et al. | 310/358 |

FOREIGN PATENT DOCUMENTS

JP    10322158 A    * 12/1998

OTHER PUBLICATIONS

T. Aoki et al., "Measurement of d15 Shear-Mode Piezoelectric Response in PZT Thin Film," Key Engineering Materials vols. 421-422 (2010) pp. 95-98; Pub. Date: Aug. 23-27, 2009, Abstract Only.
T. Aoki et al., "Measurement of d15 Shear-Mode Displacement in Ferroelectric PZT Film," Key Engineering Materials vols. 421-422 (2010) pp. 95-98; Pub. Date: Dec. 3, 2009.
S. Zhang et al., Piezoelectric Shear Coefficients of Pb(Zn1/3Nb2/3)O3-PbTiO3 Single Crystals, Jpn. J. Appl. Phys. 41 (2002) pp. L1099-L1102; Pub. Date: Aug. 5, 2002, Abstract Only.
T. Yu et al., "Expitaxial Pb (Zr0.53Ti0.47)O3/LaNiO3 Heterostructures on Single Crystal Substrates," Appl. Phys. Lett. 69 (14), Sep. 30, 1996.

(Continued)

*Primary Examiner* — Thomas Dougherty (57) ABSTRACT

A piezoelectric thin film device comprises a piezoelectric thin film having upper and lower surfaces and a defined tilted crystal morphology, a top electrode disposed on the upper surface, a substrate having a surface morphology that corresponds to the defined crystallographically tilted morphology, and a bottom electrode disposed between and crystallographically linked to both the lower surface of the piezoelectric thin film and the substrate surface, the bottom and top electrodes having a parallel planar configuration relative to the plane of the substrate and the defined crystallographically tilted morphology having a crystallographic c-axis direction oriented at a >0° angle relative to the normal to the plane of the electrodes; and method of making the device.

12 Claims, 7 Drawing Sheets

OTHER PUBLICATIONS

C. H. Cheng et al., "Analysis and Experiment for the Deflection of a Shear-Mode PZT Actuator," Institute of Physics Publishing, Smart Materials and Structures 16 (2007) 230-236.

C. Majidi et al., "Analysis and Design Principles for Shear-Mode Piezoelectric Energy Harvesting with ZnO Nanoribbons," Institute of Physics Publishing, Smart Materials and Structures 19 (2010) 055-027; published Apr. 16, 2010.

* cited by examiner

FIG. 5

ARCHITECTURE FOR PIEZOELECTRIC MEMS DEVICES

BACKGROUND

High performance piezoelectric microelectromechanical system (MEMS) devices are limited by the lower piezoelectric coefficients of thin films compared to their bulk counterparts. Today, piezoelectric MEMS architectures are largely activated with the $d_{31}$ piezoelectric coefficient (field applied in the "3" direction, displacement in the "1" direction). The $d_{33}$ piezoelectric coefficient (field applied in the "3" direction, displacement in the "3" direction) is also a component of the displacement. Herein is described a method to augment this displacement using a shear component of displacement.

BRIEF DESCRIPTION OF THE DRAWINGS

For a detailed description of exemplary embodiments of the invention, reference will now be made to the accompanying drawings in which:

FIGS. 1A-C illustrate three types of piezoelectric device architectures according to various embodiments.

FIGS. 2A-C illustrate a cantilever device with a crystallographically tilted piezoelectric film, in accordance with some embodiments. FIG. 2A illustrates the device in a non-actuated state, while

NOTATION AND NOMENCLATURE

Certain terms are used throughout the following description and claims. In the following description and in the claims, the terms "including" and "comprising" are used in an open-ended fashion, and thus should be interpreted to mean "including, but not limited to . . . ."

The term "electromechanical strain" refers to strain induced by an electric field and is commonly expressed in terms of one or more piezoelectric coefficients ($d_{33}$ and $d_{31}$, for example), where $d_{ij}$ (units pm/V or C/N) is the tensor property that relates the strain to the applied electric field (V/m) or the polarization to the applied stress (C/N).

Use of the term "tilted" crystal morphology or "crystallographically tilted" morphology refers to a single crystal or epitaxial thin film structure in which the out-of-plane crystallographic direction is not parallel to the normal of the substrate surface.

The term "miscut" refers to a single crystalline or single crystalline-like material that has a known "tilted" crystal morphology. Such material is often referred to as having a specific degree of "miscut."

The term "biaxially textured substrate" refers to a substrate which is comprised of a thin film of single crystalline like material (crystallographically oriented in and out of the plane of the substrate) upon a polycrystalline or amorphous substrate. Such a structure is typically achieved using Ion Beam Assisted Deposition (IBAD).

The term "limited domain orientations" generally refers to a piezoelectric material in which the number of orientations the spontaneous polarization within the unit cell can take is controlled.

In the context of piezoelectric thin films and conductive oxide electrodes, the term "epitaxy" refers to the fact that the crystallographic order of the deposited film is significantly influenced by that of the substrate as a result of some degree of atomic registry between the film and the substrate along the interface.

The term "fiber texture" refers to a thin film which is deposited in such manner that the crystallographic planes in the film are well-oriented out of the plane of the substrate, however randomly oriented in the plane of the substrate.

The term "morphotropic region" refers to compositions where multiple perovskite phases co-exist, and "morphotropic phase boundary" refers to a specific composition where two or more perovskite phases co-exist.

The term "spontaneous polarization" refers to the polarization measured at zero field during a polarization hysteresis measurement. It is a unique characteristic of polar, non-linear dielectrics.

The term "about" when referring to a numerical value or range is intended to include larger or smaller values resulting from experimental error that can occur when taking measurements. Such measurement deviations are usually within plus or minus 10 percent of the stated numerical value.

Temperature, ratios, concentrations, amounts, thicknesses, angles, and other numerical data may be presented herein in a range format. It is to be understood that such range format is used merely for convenience and brevity, and should be interpreted flexibly to include not only the numerical values explicitly recited as the limits of the range, but also to include all the individual numerical values or sub-ranges encompassed within that range as if each numerical value and sub-range is explicitly recited. For example, a degree of "tilt" in the range of greater than 0° to about 45° should be interpreted to include not only the explicitly recited limits of >0° and 45°, but also to include every non-zero intervening angle such as 1°, 10°, and 25°, and all sub-ranges such as 0.1° and 35°, 0.5° to 15°, and so forth.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

Piezoelectric Thin Film Device.

Figure 1A:
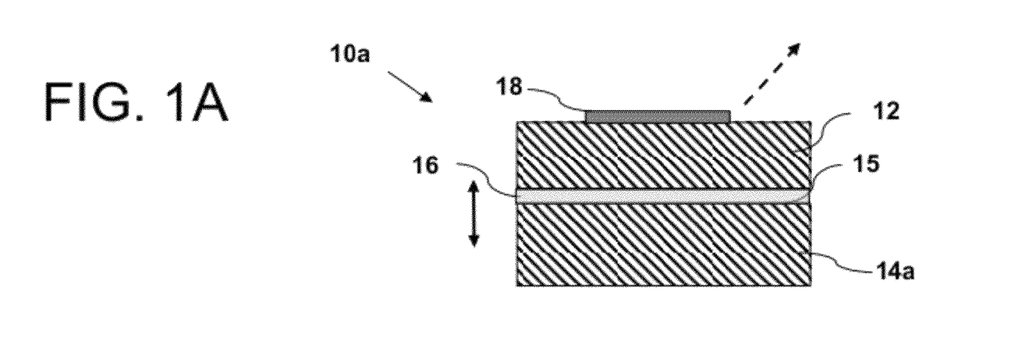
FIG. 1A is a schematic illustration of a crystallographically tilted piezoelectric film on a miscut single crystalline substrate with an intervening conductive electrode, in accordance with certain embodiments.
Figure 1B:
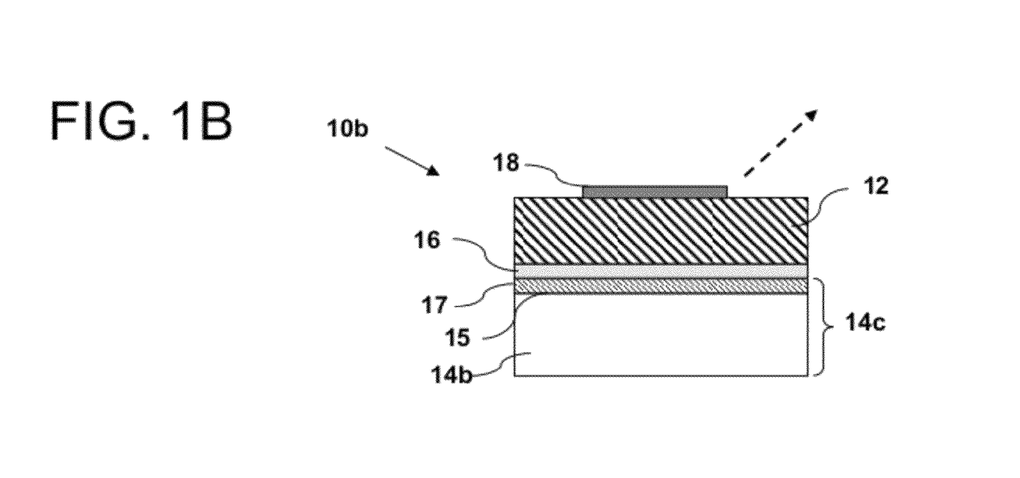
FIG. 1B illustrates a piezoelectric film on a crystallographically tilted biaxially textured template, with an intervening crystallographically compatible conductive electrode, on a polycrystalline or amorphous substrate.
Figure 1C:
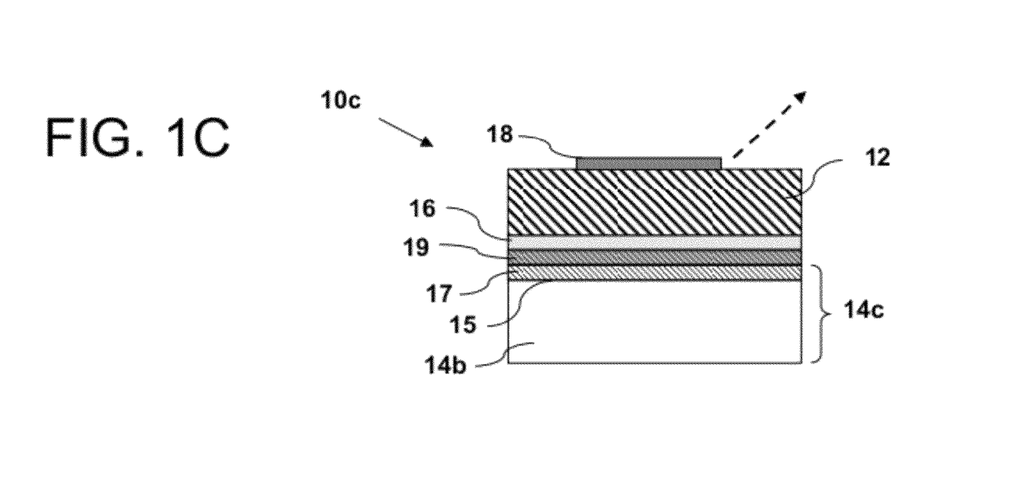
FIG. 1C illustrates an embodiment similar to that of FIG. 1B except that it includes an intervening layer of crystallographically compatible material between the biaxially textured template and the conductive bottom electrode.

FIGS. 1A-C illustrate examples of a piezoelectric thin film device 10a, 10b or 10c having a "tilted" thin piezoelectric crystalline film 12 deposited on a substrate 14a or 14c. Substrates 14a and 14c have a "tilted" crystallographic morphology similar to that of the piezoelectric crystalline film 12. This means that the substrate surface, and any intervening layers, and the tilted piezoelectric film have similar unit cell dimensions in one or more crystallographic planes, the difference being on the order of 10% or less between successive layers. That is, the atomic registry in one or more of the film's crystallographic directions matches the atomic registry in one or more of the substrate's crystallographic directions. In the example shown in FIG. 1A, substrate 14a is a miscut single crystal substrate. In FIGS. 1B-C, substrate 14c is a biaxially textured substrate in which the top surface 15 of a smooth polycrystalline or amorphous substrate 14b is covered with a material configured as a biaxially textured layer 17. One or more bottom electrode 16 are disposed directly on the top of substrate 14a (FIG. 1A), or directly on top of the biaxially textured layer 17 in some embodiments of a piezoelectric thin film device 10b (FIG. 1B). In the example shown in FIG. 1C, one or more crystallographically compatible layers 19, sometimes referred to herein as "intervening layers," are disposed between bottom electrode 16 and biaxially textured layer 17 of substrate 14c. The piezoelectric thin layer 12 is disposed directly on top of the bottom electrodes 16. In the examples shown in FIGS. 1A-C, the conductive electrode 16 is crystallographically linked to the adjacent miscut substrate 14a or to the biaxial textured layer 17, either directly (FIG. 1B) or indirectly via an intervening crystallographically matched (compatible) material (FIG. 1C). Still other embodiments are similar to FIG. 1C, except that the substrate is a miscut single crystal material as in 14a of FIG. 1A instead of a biaxially textured substrate 14b. In FIGS. 1A-C, one or more top electrodes 18 are disposed on the piezoelectric thin film 12.

Figure 2A:
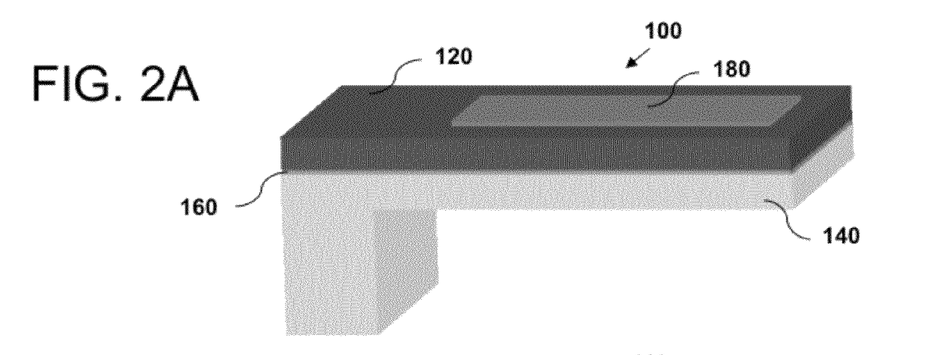
Figure 2B:
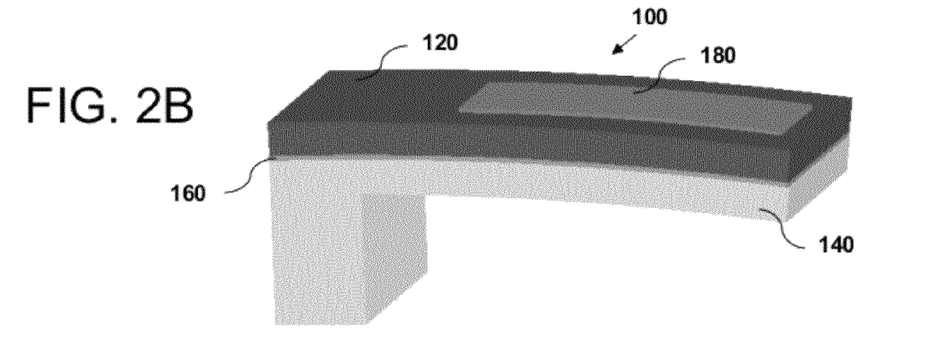
FIGS. 2B and 2C show actuated states.
Figure 2C:
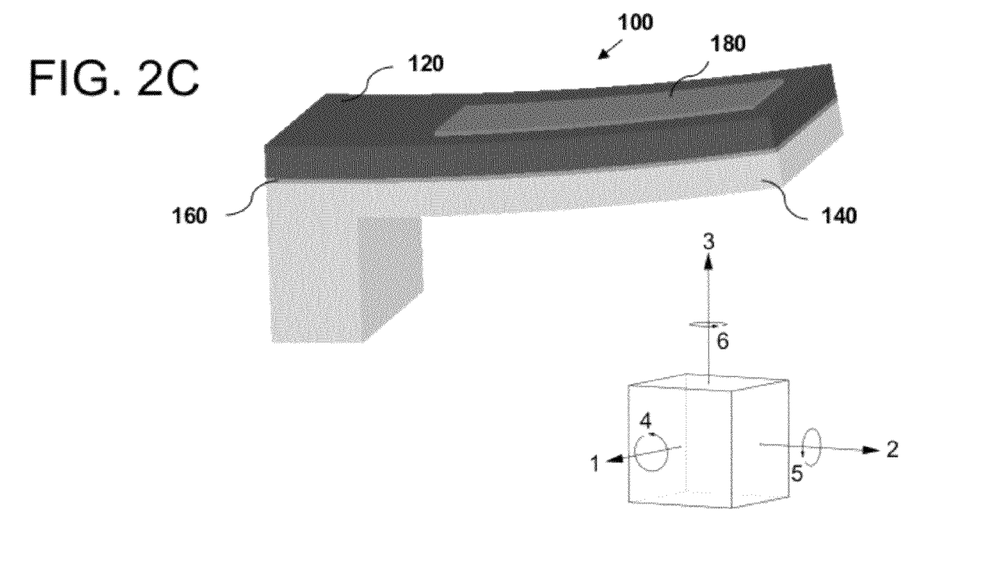

FIGS. 2A-C illustrate an example of a thin film piezoelectric cantilever device 100 which is configured for use as an actuator. Cantilever 100 includes a substrate 140. A bottom electrode 160 is disposed directly on substrate 140, similar to the arrangement shown in FIG. 1A. A crystallographically "tilted" thin piezoelectric crystalline film 120 is disposed directly on the bottom electrode 116. A top electrode 180 is disposed directly on the piezoelectric thin film 112 opposite and parallel to bottom electrode 160. Alternatively, the piezoelectric film, electrodes and substrate may be configured as shown in FIG. 1B or 1C. FIG. 2A shows the cantilever device in a non-actuated state. FIGS. 2B and 2C show the device in an actuated state, dependent on the polarity of voltage applied across the piezoelectric film.

The top and bottom electrodes 180, 160 are parallel planar electrodes that substantially span the opposite surfaces of the piezoelectric film. The electrodes are parallel with the plane of the device. The top and bottom electrodes may each be either a discrete electrode or may comprise more than one electrode which, in combination, are configured to create electric fields primarily perpendicular (90° angle) to the plane of the device. Therefore, references herein to "an electrode" or "the electrode" should be understood to include a single electrode and multiple electrodes. Electrical connections are coupled to the top and bottom electrodes, respectively (not shown). For reference, the coordinate axes in FIG. 2C shows the nomenclature used when describing the response of a piezoelectric element. 1, 2 and 3 refer to normal directions (with "3" typically noted as perpendicular to the plane of the device). For example, in FIG. 2A, if an electric voltage is applied between the electrodes it would be applied in the "3" direction. If the resulting strain was also measured in the "3" direction, the piezoelectric coefficient $d_{33}$ would be measured. If the resulting strain was measured in the "1" direction, the piezoelectric coefficient $d_{31}$ would be measured. For the examples shown in FIGS. 2A-C, the strain in the "2" direction is equal to the strain in the "1" direction, thus $d_{31}$ is equal to $d_{32}$. Henceforth only $d_{31}$ will be referred to. FIG. 3B, which is described in more detail below, more clearly illustrates these displacements for a free-standing piezoceramic in which the substrate and seed layer have been removed and the opposing electrodes are of equal elastic stiffness.

In addition to the normal directions and displacements (1, 2, and 3), there are shear displacements which can occur. These are manifested as internal rotations of the spontaneous polarization due to an applied electric field, and are noted as (4, 5, and 6). A poled polycrystalline piezoelectric material 160 (as depicted in FIGS. 2A-C) has two, equivalent, shear piezoelectric coefficients: $d_{15}$ and $d_{24}$. Henceforth only $d_{15}$ will be referred to. FIG. 3C, which is described in more detail below, illustrates the displacement due to the $d_{15}$ piezoelectric coefficient.

To utilize the $d_{15}$ coefficient in a piezoelectric device, one must be able to apply an electric field perpendicular (at 90°) to the spontaneous polarization direction. FIGS. 3D-G, which are further described below, illustrate one mechanism to achieve this, wherein the spontaneous polarization is aligned at an inclined angle (γ) to the overall surface normal. The inclined angle (γ) is <45°.

Figure 3A:
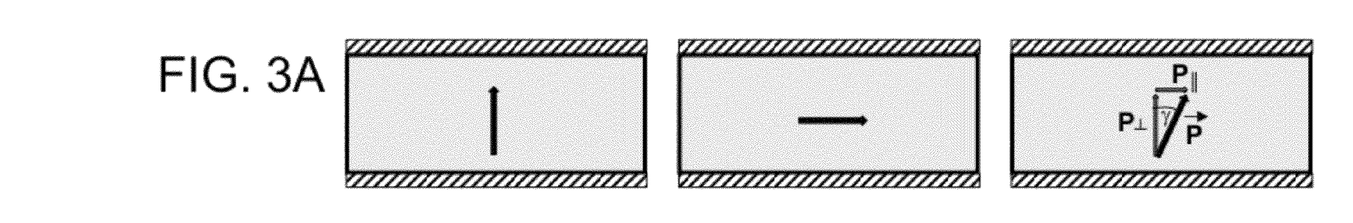
FIG. 3A illustrates schematically polarization directions perpendicular to electrodes (left), parallel to electrodes (center), and at a tilted angle (γ) with respect to the normal direction of the device. The geometrically resolved components of a tilted polarization are indicated in the FIG. 3A (right).
Figure 3B:
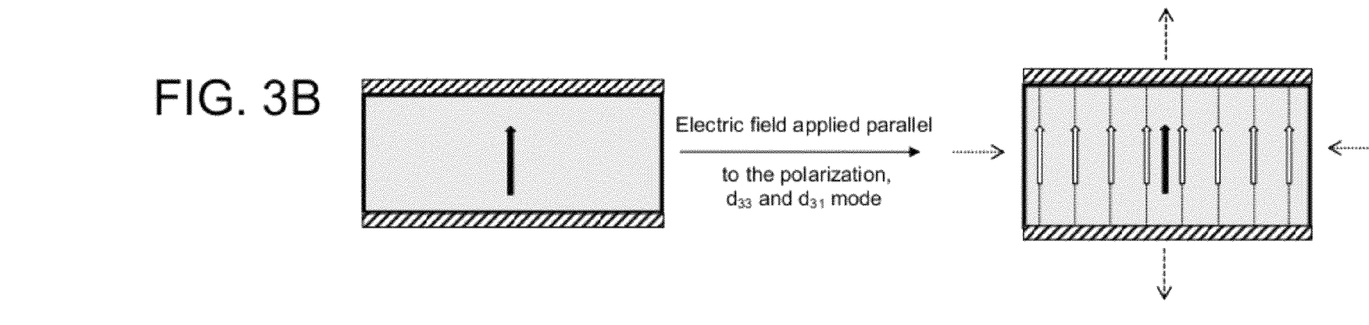
FIG. 3B illustrates the deformation of a piezoelectric film when a field is applied parallel to the direction of the spontaneous polarization in the material.
Figure 3C:
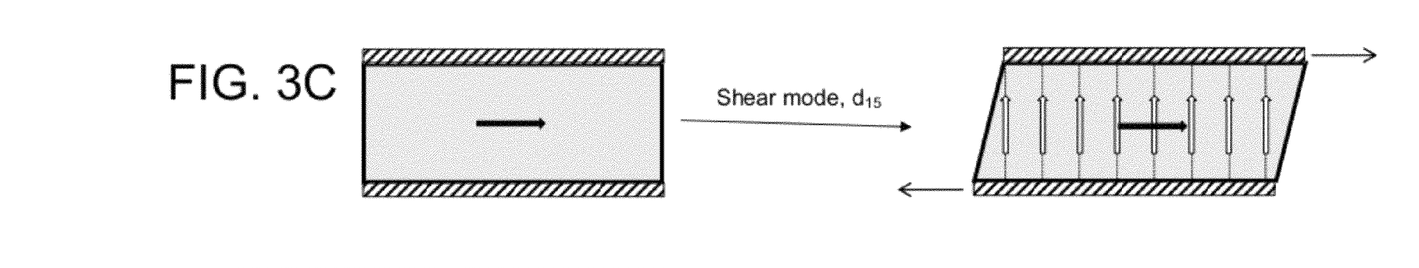
FIG. 3C illustrates the deformation of a piezoelectric film when a field is applied perpendicular (at 90°) to the direction of the spontaneous polarization in the material.

FIG. 3A illustrates schematically the geometrically resolved components of polarization in a piezoelectric material when no electric field is applied. The piezoelectric material (gray block) has parallel planar top and bottom electrodes (diagonal filled bars) on opposite surfaces. In this case, a geometric component (P||, parallel to the device electrodes, in FIG. 3A) of the spontaneous polarization is normal (at 90°) to the applied field and the $d_{15}$ piezoelectric coefficient can be utilized. The polarization vector (P) of the piezoelectric material is indicated by a solid tilted arrow, and its parallel and perpendicular polarization components with respect to the electrodes (P|||| and P⊥) are shown by respective horizontal and vertical arrows in FIG. 3A.

FIG. 3B illustrates these displacements for a free-standing piezoceramic with no substrate and with opposing electrodes are of equal elastic stiffness, as in FIG. 3A. The direction of $d_{33}$ strain is indicated by dashed arrows. The dotted arrows indicate the direction of $d_{31}$ strain. An electric field applied parallel to the polarization causes the PZT to become thicker ($d_{33}$) and shorter ($d_{31}$). If the electric field were instead applied opposite to the polarization direction, the PZT would become thinner and longer.

FIG. 3C illustrates the displacement due to the $d_{15}$ piezoelectric coefficient for a free-standing piezoceramic in which the substrate and seed layer have been removed and the opposing electrodes are of equal elastic stiffness. In this case, both thickness and length of the PZT film is unchanged when an electric field is applied parallel to the polarization direction (indicated by heavy dark arrows). The direction of d15 strain is indicated by the light arrows.

Figure 3D:
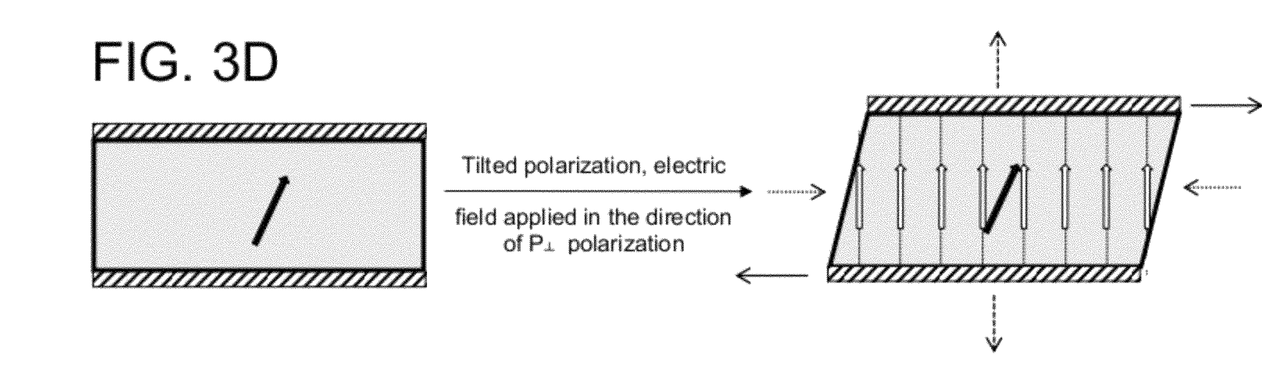
FIG. 3D illustrates the deformation of a piezoelectric film when a field is applied to a piezoelectric film with a tilted polarization according to some embodiments, and the field is parallel to the geometrically resolved component of polarization normal to the electrodes ($P_\perp$).

FIG. 3D illustrates the total strain of the piezoelectric material of FIG. 3A (right) when an electric field is applied in a direction perpendicular to a component of the polarization direction. Here, the electric field and the geometrically resolved component of polarization normal to the electrodes are parallel. The direction of strain due to the $d_{15}$ piezoelectric coefficient is indicated by the solid light arrows. The direction of strain due to the $d_{31}$ piezoelectric coefficient is indicated by dotted arrows. The direction of strain due to the $d_{33}$ piezoelectric coefficient is indicated by dashed arrows. The $d_{15}$ mode is responsible for shear deformation, $d_{33}$ is responsible for the thickness increase, and $d_{31}$ is responsible for the decrease of PZT length shown in FIG. 3D. The drawings are not drawn to scale, as the shear strain in the direction parallel to the plane of the device creates an angle that is much smaller compared to the tilt angle of the piezoelectric material (illustrated in FIGS. 1A-C), which, in many cases, is in the range of about 0.5° to about 45°. Accordingly, the strain in all directions is exaggerated so that it is visible in the illustrations. It should also be noted that the illustrations in FIGS. 3A-G are for a free-standing piezoceramic in which the substrate and seed layer have been removed and the opposing electrodes are of equal elastic stiffness. The presence of a substrate would lead to bending of the structure (as in FIG. 2C, for instance), in which the shape of the bent structure depends on how the structure is mounted and the direction of the electric field with respect to the polarization. This property is further described below with respect to FIGS. 3F and 3G.

Figure 3E:
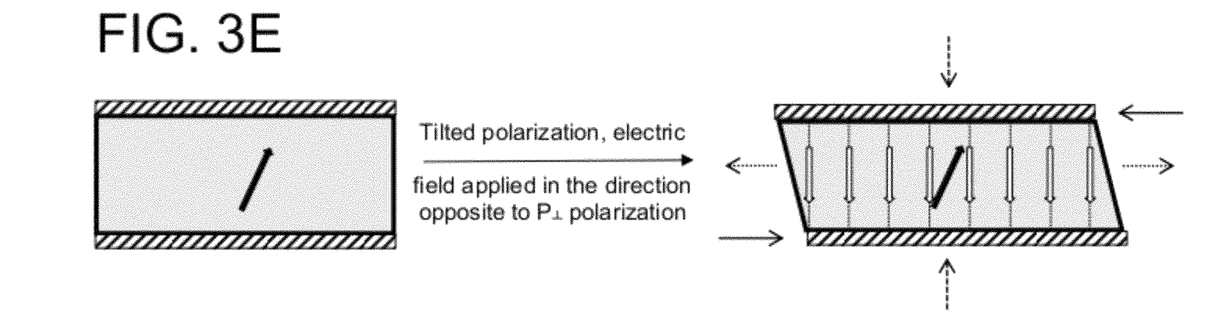
FIG. 3E illustrates the deformation of a piezoelectric film when a field is applied to a piezoelectric film with a tilted polarization according to some embodiments and the field is anti-parallel to the geometrically resolved component of polarization normal to the electrodes ($P_\perp$).

FIG. 3E is analogous to FIG. 3D, however in this case the electric field and the geometrically resolved component of polarization normal to the electrodes are anti-parallel. The displacements for this configuration are shown on the right side of the figure. The $d_{15}$ mode is responsible for shear deformation in the opposite direction compared to FIG. 3D. In this case, $d_{33}$ is responsible for thickness decrease and $d_{31}$ for increase of PZT length.

Figure 3F:
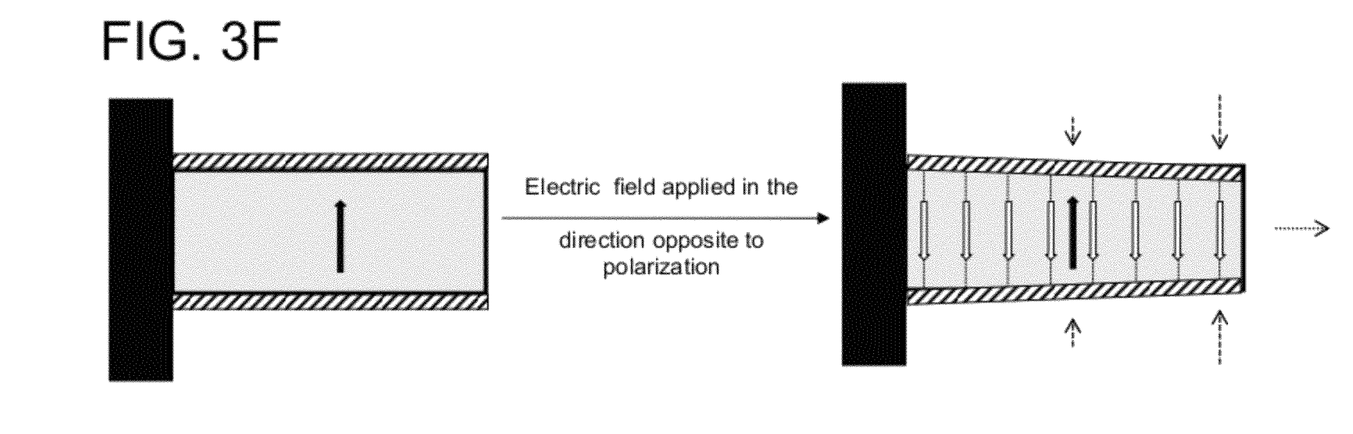
FIG. 3F illustrates the deformation of a piezoelectric film constrained at one end when a field is applied anti-parallel to the direction of spontaneous polarization.

FIG. 3F illustrates the deformation of a piezoelectric film constrained at one end when a field is applied anti-parallel to the direction of spontaneous polarization (when the spontaneous polarization is not tilted). The piezoelectric $d_{33}$ coefficient is responsible for the thickness contraction at the free end, indicated by dashed arrows. Note that thickness contraction is maximum at the free end of the film and absent at the clamped end. The piezoelectric $d_{31}$ coefficient is responsible for the extension of the material, indicated by the dotted arrow.

Figure 3G:
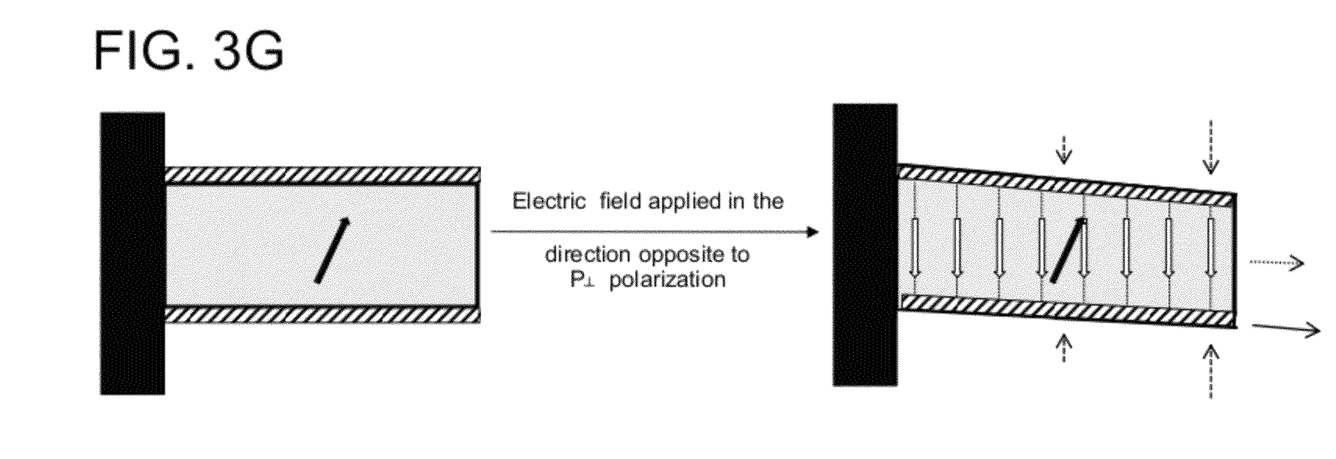
FIG. 3G illustrates the deformation of a piezoelectric film constrained at one end with a tilted polarization when a field is applied anti-parallel to the geometrically resolved component of polarization normal to the electrodes ($P_\perp$) according to some embodiments.

FIG. 3G illustrates the deformation of a piezoelectric film with a tilted polarization which is constrained at one end when a field is applied anti-parallel to the geometrically resolved component of polarization normal to the electrodes. This is analogous to FIG. 3F, however in this example the piezoelectric $d_{15}$ coefficient causes a bending of the piezoelectric material when an electric field is applied in the direction opposite to P⊥ polarization.

Referring again to FIG. 2A, in operation, electrical connections (not shown) are coupled to the top and bottom electrodes. Electrodes 160, 180 create electric fields perpendicular (90°) to the plane of substrate 140. When this electric field is applied perpendicular to the spontaneous polarization, or a geometric component of the spontaneous polarization (as with a tilted spontaneous polarization), of piezoelectric thin film 120, the resulting shear displacement is proportional to the $d_{15}$ piezoelectric coefficient. This causes piezoelectric thin film 120 and substrate 140 to actuate in a manner to cause displacement of the free end of the cantilever, as indicated in FIG. 3G and FIGS. 2B and 2C. When the electric field is removed piezoelectric thin film 120 and substrate 140 of actuator 100 return to their initial configuration.

For polycrystalline poled ceramics there are three independent elements in the piezoelectric property tensor; $d_{33}$, $d_{15}$, and $d_{31}$. In a thin film geometry the poled ferroelectric direction is typically delineated as "3" (out-of-plane) and the in-plane axes are denoted as "1" and "2" (and are equivalent). It has been widely established that the piezoelectric coefficients in PZT decrease in order of $|d_{15}|>|d_{33}|>|d_{31}|$. For bulk materials the values can vary dependent upon chemical doping. Typical reported values for undoped PZT are $d_{15}$=494 pm/V, $d_{33}$=223 pm/V and $|d_{31}|$=93.5 pm/V. The absolute values may vary, however the general trend in magnitude does not change. Some typical piezoelectric coefficients of representative PZT compositions available in the commercial market range from 390 to 800 pm/V ($d_{33}$), 190 to 360 pm/V ($|d_{31}|$), and 550 to 1000 ($d_{15}$).

The disclosed MEMS device platform utilizes the shear piezoelectric coefficient $d_{15}$ to a significantly greater degree than was possible previously with piezoelectric MEMS devices in use today. The $d_{15}$ shear coefficient is the largest independent piezoelectric coefficient for a poled piezoelectric thin film. As $d_{15}$ is the largest of the three independent piezoelectric coefficients (i.e., $|d_{15}|>|d_{33}|>|d_{31}|$), many embodiments of the presently disclosed piezoelectric and MEMS devices perform with higher actuation force and deflection per applied voltage, compared to devices designed to utilize primarily $d_{31}$ and/or $d_{33}$.

There are currently no ferroelectric/piezoelectric MEMS devices in commercial use which are designed for augmentation of actuation force and deflection by utilizing the $d_{15}$ piezoelectric shear coefficient. There have been efforts to utilize $d_{15}$ in piezoelectric ZnO and AlN thin film devices deposited via oblique physical vapor deposition. Those materials are not perovskites or perovskite-derivative materials, however. In contrast to oblique physical vapor deposition techniques, the presently disclosed methods achieve a quite different architecture in which the substrate influence is utilized to achieve the tilted piezoelectric crystal structure. Not only is this approach fundamentally different from a thin film deposition standpoint, but the performance of many embodiments of the resulting device architecture is expected to be far above that of ZnO or AlN-based devices.

The most common geometry for a MEMS actuator is based on a planar structure. That is, the active piezoelectric material is "sandwiched" between two electrode layers. For polycrystalline PZT films with compositions near the morphotropic phase boundary (i.e., 52/48 mol % Zr/Ti) this results in the spontaneous polarization always being aligned with the electric field applied between the planar electrodes. This is largely because, for morphotropic compositions, there are 14 possible ferroelectric domain orientations that can align with the applied electric field. The spontaneous polarization is free to respond to the applied electric field. This makes utilization of the shear piezoelectric ($d_{15}$) response very difficult since it is difficult to obtain a component of the spontaneous polarization normal to the applied electric field. Many embodiments of the presently disclosed devices now make it practical to access and utilize $d_{15}$ in thin film MEMS architectures based on perovskite or perovskite-derivative piezoelectric materials and significantly enhance the piezoelectric response compared to devices utilizing only $d_{31}$ and/or $d_{33}$.

Figure 4:
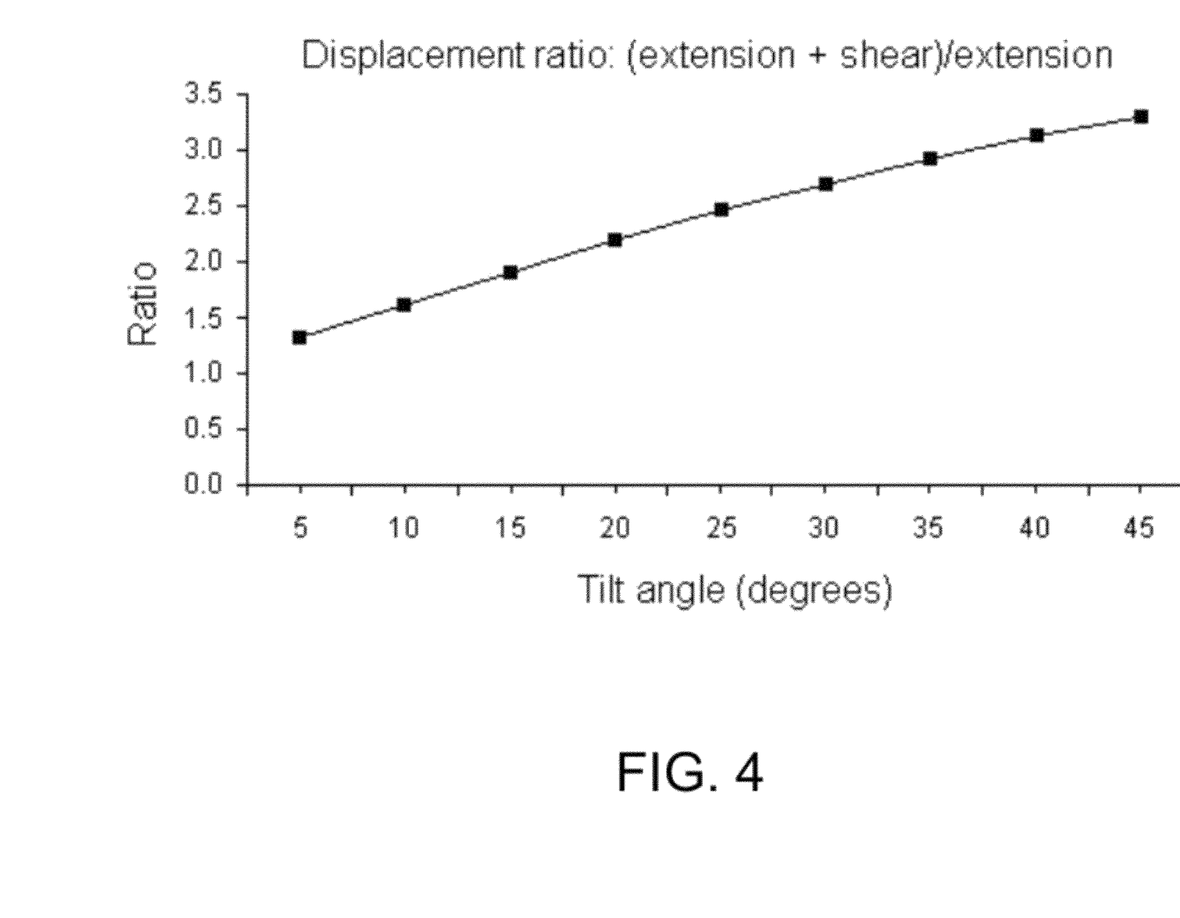
FIG. 4 is a plot of total calculated displacement ratio versus a range of crystallographic tilt angles that are utilized in some embodiments.

FIG. 4 illustrates the augmentation of the overall device displacement as a function of spontaneous polarization tilt angle, γ in FIG. 3A (right) resulting from the crystallographic tilt.

Manufacture of a Piezoelectric Thin Film Device.

To make practical use of the shear piezoelectric response from the piezoelectric coefficient $d_{15}$, a method of depositing a piezoelectric film with a crystallographic "tilt" relative to a device's planar electrodes was developed. Referring to FIG. 1A, a crystallographically "tilted" thin piezoelectric crystalline film 12 is formed on a substrate 14. An "appropriate lattice match" or a "corresponding substrate structure" means that the substrate and the tilted piezoelectric film have similar unit cell dimensions in one or more crystallographic planes, the difference being on the order of 10% or less. That is, the atomic registry in one or more of the film's crystallographic directions should closely match the atomic registry in one or more of the substrate's crystallographic directions. This may be accomplished using either a miscut single crystal substrate (FIG. 1A) or using a biaxially textured substrate (FIGS. 1B and 1C), for example. Suitable single crystal miscut substrates are available for purchase from a number of known commercial suppliers.

For some applications, biaxially textured substrates may be more desirable, as the biaxially textured layer 17 can be deposited upon an arbitrary smooth substrate 14 via ion beam assisted deposition (IBAD). Suitable IBAD techniques are described in U.S. Pat. Nos. 6,312,819, 6,756,139, and 6,800, 591, for example. IBAD deposition allows for integration of the tilted piezoelectric material on larger scale and less expensive substrates, compared to single crystal substrates. The IBAD (biaxially textured) layer is typically a material with the rock salt (halite) crystal structure, such as MgO, SrO, TiN, or CaO. It can also be achieved in materials based on the fluorite structure ($Y_2O_3$—$ZrO_2$ or $SnO_2$—$In_2O_3$). The tilt of this biaxially textured layer is induced during the deposition step. Without being limited to any particular theory to explain the development of texture for rock salt materials disposed via the IBAD process, or any other crystalline material, it is thought that the IBAD process results in biaxial texture via preferential sputtering during deposition of the rock salt material. An ion assist beam is incident upon the condensing vapor at a particular crystallographic angle (in the case of rock salt materials, 45° or the <110> family of directions). As film growth proceeds, nuclei that are aligned with the ion assist grow, while those that are not aligned with the ion assist are sputtered away or overgrown. Alternatively, any other suitable technique may be used to create a substrate surface that is compatible with depositing a piezoelectric material with a crystallographically tilted crystal morphology.

Referring still to FIG. 1A, a conductive oxide is deposited on the top surface 15 of substrate 14a to form a planar bottom electrode (electrode 16) parallel to the plane of the substrate. In most embodiments the conductive oxide covers the entire top surface 15, and is from 50 nm to 1000 nm thick. In most embodiments the electrode layer is from 100 nm to 500 nm thick, and in some cases is 75 nm to 250 nm thick. To achieve the tilted thin film, a substrate 14 having an appropriate lattice match is used which is similarly "tilted" in the orientation desired for the thin film 12. The bottom electrode is in direct contact with piezoelectric thin film 12. The piezoelectric thin film 12 is then formed epitaxially on the bottom electrode 16 using any suitable deposition method. In most embodiments a suitable piezoelectric thin film thickness is from 0.05 μm to 1 μm, and for some applications a thin film up to 10 μm is formed. In some cases, the piezoelectric thin film is from 0.1 μm to 10 μm thick, from 0.5 μm to 3 μm or from 0.075 μm to 0.5 μm, for example. To achieve the tilted thin film, a substrate 14 having an appropriate lattice match is used which is similarly "tilted" in the orientation desired for the thin film 12. A top electrode 18 is disposed directly on top of the thin film 12 and is from 50 nm to 500 nm thick in most cases. In some instances, the top electrode is from 75 nm to 250 nm thick. The diagonal lines running through the substrate 14, bottom electrode 16 and thin film 12 in FIG. 1A represent the tilted crystallographic morphology of the device. The tilted crystallographic c-axis direction is indicated by a dashed arrow. The direction of the intended electric field and surface normal is indicated by a solid bi-directional arrow. In various embodiments, the degree of "tilt" imparted to a piezoelectric film is in the range of >0° to about 45°, and in many cases is in the range of about 0.5° to about 45° relative to the normal direction of the electrodes of a device. For some applications, a tilt angle in the range of about 0.5° to about 15° is desirable.

The example illustrated in FIG. 1B is prepared as described for FIG. 1A, except that a smooth polycrystalline or amorphous substrate is used instead of a miscut single crystal or single crystalline-like material, and a biaxially textured template layer 17 is formed on the smooth polycrystalline or amorphous surface as described above. The biaxial layer 17 is typically from 10 nm to 1 μm thick.

To produce the piezoelectric thin film device illustrated in FIG. 1C, one or more layers 19 of crystallographically compatible material is deposited on the biaxially textured template layer 17. These "intervening" layers have a similar crystallographic structure to that of biaxially textured layer 17 and, when present, are also typically from 10 nm to 1 micron thick. Each intervening layer 19 is a dielectric or conductive material that is epitaxially formed on the substrate or on a preceding layer 19 using any suitable deposition method. Bottom electrode 16 is applied over layer 19, by epitaxial growth, so that the resulting electrode layer 16 is crystallographically linked to the biaxially textured layer 17 via the one or more layers 19. As an example, a biaxially textured template layer 17 may have a unit cell lattice dimension that deviates by more than 10% from that of the piezoelectric layer 12 which is to be epitaxially formed on the template 17. In that case, an intervening layer 19 of crystallographically compatible material is configured to adjust or make up for the mis-matched crystallographic spacing between the template 17 and the desired piezoelectric layer 12, may be deposited on the template layer 17. By application of one or more intervening layers 19, a closer match to the desired piezoelectric lattice may be achieved.

A calculation of the increase in the peak in-plane displacement possible when the shear due to the $d_{15}$ mode is combined with the expansion due to the $d_{31}$ mode as a function of the tilt angle shows that even a modest tilt angle increases the peak displacement significantly. This is principally due to $d_{15}/d_{31}$ being approximately 3.67 in the case of thin film PZT (Aoki et al., 18th IEEE International Symposium on the Applications of Ferroelectrics, 2009, pp. 1-4). FIG. 4 is a graph showing how the contribution to the induced strain from the shear piezoelectric displacement mode depends on the crystallographic tilt angle.

Figure 5:
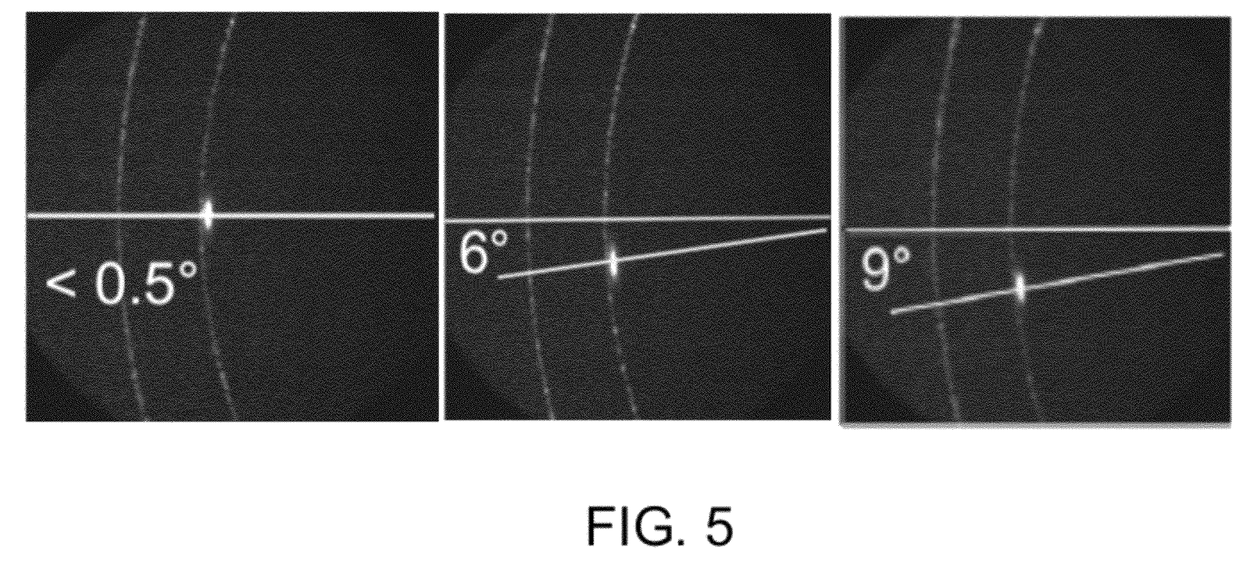
FIG. 5 shows 2-dimensional x-ray diffraction patterns for biaxially textured template layers with various degrees of crystallographic "tilt," in accordance with some embodiments.

A series of 2-dimensional x-ray diffraction patterns for three IBAD-MgO biaxially textured layers is shown in FIG. 5. Panel (a) tilt <0.5°, panel (b) tilt=6°, and panel (c) tilt=9°. For these images, the 2θ diffraction angle increases from right to left within each panel. The displacement from the center line is indicative of the angle of crystallographic tilt in the biaxially textured template layer. The spot depicted in each of (a), (b) and (c) is the diffraction peak for biaxially textured MgO (002) and the rings are the diffraction peaks for the polycrystalline Ni-based superalloy substrate. It is clear that significant tilt may be achieved in the IBAD MgO layer.

As in the case of a miscut single crystal substrate, a conductive oxide layer (lattice matched) is deposited upon the IBAD biaxially textured layer or an intervening layer to form the bottom planar electrode. The bottom electrode layer in all cases is between 0.05 μm and 1 μm, and in most cases is about 0.1 μm to about 0.5 μm. In some cases the bottom electrode is from 0.075 μm to 0.25 μm thick. Upon the bottom planar electrode, the piezoelectric thin film is deposited by a suitable chemical or physical deposition method, and a top electrode is disposed on top of the thin film, to produce a device similar to any of those shown in FIGS. 1A-C. Any known chemical deposition method may be used for forming the conductive oxide bottom electrode, the piezoelectric thin film and layers 19. Such methods include, but are not limited to, solution-gelation (sol-gel), metalorganic decomposition (MOD) and hybrid-chelate processes as described by Budd, Dey, and Payne Br. Cer. Proc. 36:107 (1985), Lin, Hsu and Lin, Appl. Surf. Sci., 142:418-421 (1999) and Assink and Schwartz, Chem. Mater., 5:511-517 (1993), respectively, for example. Suitable physical vapor deposition methods for these materials include sputtering and pulsed laser deposition, as described by Kanno, et al., Journ. Appl. Phys. 93, 4091-4096, 2003 and Ramesh, et al. Appl. Phys. Lett. 61, 1537-1539, 1992, for example. Alternatively, any other suitable chemical or physical deposition technique may be employed to form a single phase piezoelectric thin film material with the desired tilted crystal morphology on a substrate, or to form a bottom electrode or to form an intervening layer between the substrate and the bottom electrode.

Most of the disclosed ferroelectric/piezoelectric materials have multiple domain orientations, in many cases having as many as 14 domain orientations (e.g., morphotropic $Pb(Zr,Ti)O_3$). In the ferroelectric/piezoelectric materials used in the disclosed devices and methods, it is desired to limit the number of domain orientations such that the spontaneous polarization cannot follow (fully align with) the electric field when applied between the planar electrodes. This will result in a geometric component of the polarization which is normal to the applied electric field, which is a requirement to achieve the $d_{15}$ shear piezoelectric contribution. For instance, $Pb(Zr_{0.3}Ti_{0.7})O_3$ is a composition within the tetragonal phase field for PZT that results in only six possible domain orientations. When combined with an appropriately tilted or miscut substrate and deposited in an epitaxial or fiber textured fashion, a composition of this type will restrict the spontaneous polarization of the material away from the electric field imposed by the electrode geometry (i.e., the spontaneous polarization will be kept at the miscut angle of the film/substrate), and results in the ability to utilize the $d_{15}$ piezoelectric coefficient in planar devices, such as, but not limited to, MEMS devices.

A potential advantage of many embodiments of the disclosed manufacturing process is that the resulting device allows for increased or augmented utilization of the piezoelectric shear coefficient ($d_{15}$) in poled piezoelectric thin films that have a component of polarization in the plane of the device, as compared to devices prepared by other methods. As $d_{15}$ is the largest of the three independent piezoelectric coefficients (i.e., $|d_{15}|>|d_{33}|>|d_{31}|$), in many cases, including the disclosed thin film design in a MEMS architecture will result in devices with significantly improved piezoelectric performance compared to devices which utilize the piezoelectric coefficient $d_{31}$ and/or $d_{33}$ to the exclusion of the $d_{15}$ component. For the small angles of tilt employed in some of the disclosed piezoelectric thin film devices, the primary mode of actuation is $d_{31}$, in which the work of actuation is due to expansion in the plane of the substrate. The devices and manufacturing process described herein allows this $d_{31}$ actuation to be significantly augmented with the piezoelectric shear ($d_{15}$) mode. FIG. 4 shows a calculation of the augmentation that can be achieved as a function of crystallographic tilt angle for a morphotropic composition of PZT. For instance, at 10° of tilt the enhancement is 1.6× (160%). The disclosed process utilizes special substrates. For example, in some cases, single crystal substrates are used. In other some cases, an ion beam assisted deposition (IBAD) process is used in the MEMS fabrication process to deposit biaxially textured material on arbitrary smooth substrates.

Perovskite or Perovskite-Derived Piezoelectric Materials.

Some suitable perovskite piezoelectric materials for use in forming the ferroelectric piezoelectric thin films of the disclosed devices and methods include $Pb(Zr_xTi_{1-x})O_3$, $Pb(Mg_xNb_{1-x})O_3$, $PbTiO_3$, $Pb(Zn_xNb_{1-x})O_3$, solid solutions of said materials, and lead free piezoelectric materials such as those disclosed in International Patent Application Nos. PCT/US10/50947 and PCT/US10/50965.

Substrate Materials.

Some suitable single crystal substrates include, but are not limited to, $SrTiO_3$, $LaAlO_3$, $BaTiO_3$, $DyScO_3$, $MgO$, $Y_2O_3$—$ZrO_2$, and similar materials utilized for epitaxial growth of perovskite and perovskite-derivative materials. Perovskite or perovskite derivative materials include those listed above (PZT, PMN, PMN-PT, PZN, PZN-PT). IBAD deposited biaxially textured materials are rock salt and fluorite based (as referenced in U.S. Pat. Nos. 6,312,819, 6,756,139, and 6,800,591, for example). These materials can be deposited on arbitrary smooth substrates such as, but not limited to, polished Ni-based super-alloys (i.e., Hastelloy® 0276), $SiO_2/Si$, $Si_3N_4/SiO_2/Si$, glass, and polyimide.

Crystallographically Compatible Materials.

Some suitable crystallographically compatible materials for forming an intervening layer between a substrate and a bottom electrode include, but are not limited to $SrTiO_3$, $LaAlO_3$, $BaTiO_3$, $DyScO_3$, $LaMnO_3$, $CeO_2$, $La_2Zr_2O_7$, $Gd_2O_3$, and similar materials.

Bottom Electrode Materials.

In this disclosure, conductive oxide electrode materials generally refer to perovskites and perovskite-derivative materials, but can include other conductive oxides with appropriate lattice matching, such as $RuO_2$, for example. Some suitable conductive oxides include, but are not limited to, $SrRuO_3$, $LaNiO_3$, $(La,Sr)MnO_3$, and other similar perovskite or perovskite-derivative conductive materials.

Top Electrode Materials.

Suitable top electrode materials generally include, but are not limited to, metallic materials such as Ag, Ni, Cu, Pt, Pd, Au, Al, Ti. These materials can be disposed on the piezoelectric via numerous methods, including thermal evaporation, electron-beam evaporation, electroplating, and sputtering using known deposition techniques.

Some exemplary MEMS devices are configured as a cantilever for use as an actuator, as shown in FIGS. 2A-C. The substrate is a miscut crystal or biaxially textured substrate, and the piezoelectric layer and bottom electrodes are any combination of the materials listed in Table 1. The piezoelectric layer has a crystallographic tilted morphology <0° to about 45°. The top electrode is any suitably configured electrode material such as any of those described above, and spans the top surface of the piezoelectric material. Such cantilever devices are expected to provide $d_{31}$ actuation that is significantly augmented (i.e., at least 10% increased) with the piezoelectric shear ($d_{15}$) mode, compared to a similar MEMS device formed from the same materials without the piezoelectric tilted crystal morphology.

TABLE 1

| Bottom Electrode | Piezoelectric Material |
| --- | --- |
| $SrRuO_3$ | $Pb(Zr,Ti)O_3$ |
| $LaNiO_3$ | $PbTiO_3$ |
| $(La,Sr)MnO_3$ | $Pb(Mg,Nb)O_3$ |
| $RuO_2$ | $Pb(Mg,Nb)O_3$—$PbTiO_3$ |
| $SnO_2$—$In_2O_3$ | $Pb(Zn,Nb)O_3$ |
| | $Pb(Zn,Nb)O_3$—$PbTiO_3$ |
| | $Bi(Ni,Ti)O_3$—$(Bi,K)TiO_3$ |
| | $Bi(Ni,Ti)O_3$—$(Bi,Na)TiO_3$ |
| | $Bi(Ni,Ti)O_3$—$(Bi,K)TiO_3$—$(Bi,Na)TiO_3$ |
| | $(Bi,Na)TiO_3$—$(Bi,K)TiO_3$ |
| | $Bi(Zn,Ti)O_3$—$(Bi,K)TiO_3$—$(Bi,Na)TiO_3$ |
| | $Bi(Mg,Ti)O_3$—$(Bi,K)TiO_3$—$(Bi,Na)TiO_3$ |

| Single Crystal substrate | Biaxially Textured Material |
| --- | --- |
| $SrTiO_3$ | MgO |
| $BaTiO_3$ | SrO |
| $LaAlO_3$ | CaO |
| $DyScO_3$ | TiN |
| | $Y_2O_3$—$ZrO_2$ |
| | $SnO_2$—$In_2O_3$ |

The above discussion is meant to be illustrative of the principles and various embodiments of the present invention. Numerous variations and modifications will become apparent to those skilled in the art once the above disclosure is fully appreciated. For example, although cantilever type MEMS actuator devices are exemplified in the foregoing discussion, it should be understood that the disclosed principles may be similarly applied to a variety of other types of MEMS devices, which are intended to be within the scope of the invention. It is intended that the following claims be interpreted to embrace all such variations and modifications.

What is claimed is:

1. A piezoelectric thin film device comprising:
   a piezoelectric thin film having upper and lower surfaces and a defined tilted crystal morphology;
   a top electrode disposed on the upper surface;
   a substrate having a surface morphology that corresponds to said defined crystallographically tilted morphology; and
   a bottom electrode disposed between and crystallographically linked to both the lower surface of said piezoelectric thin film and the substrate surface,
   said bottom and top electrodes having a parallel planar configuration relative to the plane of said substrate and said defined crystallographically tilted morphology having a crystallographic c-axis direction oriented at a >0° angle relative to the normal to the plane of said electrodes.

2. The device of claim 1, wherein said piezoelectric thin film comprises a perovskite or perovskite-derivative material.

3. The device of claim 1, wherein said bottom electrode is a conductive oxide having a crystallographic c-axis direction corresponding to that of said piezoelectric thin film.

4. The device of claim 1 wherein, when an electric voltage is applied to said electrodes, said piezoelectric thin film exerts a greater deflection parallel to said substrate per applied voltage than a device with the same piezoelectric thin film without said crystallographically tilted morphology.

5. The device of claim 1 wherein, when an electric voltage is applied to said electrodes, said piezoelectric thin film exerts a greater $d_{15}$ piezoelectric shear mode contribution compared to a device in which the piezoelectric material lacks said crystallographically tilted morphology.

6. A process of manufacturing a piezoelectric thin film device, comprising:
   (a) forming a bottom electrode on a substrate, said bottom electrode having a planar configuration parallel to a plane of said substrate;
   (b) forming a piezoelectric thin film on a bottom electrode, said thin film having an upper surface;
   (c) inducing a defined crystallographically tilted morphology in said piezoelectric thin film, said defined crystallographically tilted morphology having a crystallographic c-axis direction at an angle >0° relative to the normal to the plane of said substrate; and
   (d) forming a top electrode on said upper surface, to provide a piezoelectric device configured to create electric fields perpendicular to the substrate.

7. The process of claim 6, wherein said substrate comprises a first surface corresponding to said defined crystallographically tilted morphology, (a) comprises epitaxially forming the bottom electrode on said substrate, and (b) comprises epitaxially forming said piezoelectric thin film on said bottom electrode, to form said piezoelectric thin film having said defined crystallographically tilted morphology.

8. The process of claim 6, comprising applying to said substrate prior to application of said bottom electrode an intervening layer, said intervening layer consisting of a material having a defined crystallographically tilted morphology compatible with that of said substrate.

9. The process of claim 6, wherein said inducing comprises inducing a defined tilted crystal morphology in the range of a 0.5° to 45°.

10. The process of claim 6, wherein said substrate has a miscut single crystal structure corresponding to said defined crystallographically tilted morphology.

11. The process of claim 6, wherein said substrate comprises a biaxially textured surface corresponding to said defined crystallographically tilted morphology.

12. The process of claim 6, wherein said piezoelectric thin film comprises a perovskite or perovskite-derivative material.

* * * * *